United States Patent
Fujita

(10) Patent No.: US 12,456,640 B2
(45) Date of Patent: Oct. 28, 2025

(54) ELECTROSTATIC CHUCK

(71) Applicant: KYOCERA Corporation, Kyoto (JP)

(72) Inventor: Wataru Fujita, Higashiomi (JP)

(73) Assignee: KYOCERA Corporation, Kyoto (JP)

( * ) Notice: Subject to any disclaimer, the term of this patent is extended or adjusted under 35 U.S.C. 154(b) by 164 days.

(21) Appl. No.: 18/274,834

(22) PCT Filed: Jan. 25, 2022

(86) PCT No.: PCT/JP2022/002708
§ 371 (c)(1),
(2) Date: Jul. 28, 2023

(87) PCT Pub. No.: WO2022/163656
PCT Pub. Date: Aug. 4, 2022

(65) Prior Publication Data
US 2024/0105489 A1    Mar. 28, 2024

(30) Foreign Application Priority Data
Jan. 28, 2021 (JP) .................................. 2021-012365

(51) Int. Cl.
H01L 21/683 (2006.01)
(52) U.S. Cl.
CPC .............................. H01L 21/6833 (2013.01)

(58) Field of Classification Search
CPC .................................................. H01L 21/6833
See application file for complete search history.

(56) References Cited

U.S. PATENT DOCUMENTS

| | | | |
|---|---|---|---|
| 5,413,360 A | 5/1995 | Atari et al. | |
| 2009/0104851 A1* | 4/2009 | Cherian | C09K 3/1463 451/36 |
| 2014/0061180 A1* | 3/2014 | Petry | H01L 21/68757 361/234 |
| 2018/0190527 A1 | 7/2018 | Watanabe et al. | |

FOREIGN PATENT DOCUMENTS

| | | |
|---|---|---|
| JP | 6-291175 A | 10/1994 |
| JP | 10-107133 A | 4/1998 |
| JP | 2004-207644 A | 7/2004 |
| WO | 2017/057273 A1 | 4/2017 |

* cited by examiner

Primary Examiner — Scott Bauer
(74) Attorney, Agent, or Firm — Procopio, Cory, Hargreaves & Savitch LLP

(57) ABSTRACT

An electrostatic chuck according to the present disclosure includes a plate-shaped body including an adsorption surface for mounting a workpiece, a base, and an electrode film located between the plate-shaped body and the base. The plate-shaped body and the base are made of sapphire. The angle between the adsorption surface and the c-plane of the sapphire is 45° or more.

3 Claims, 2 Drawing Sheets

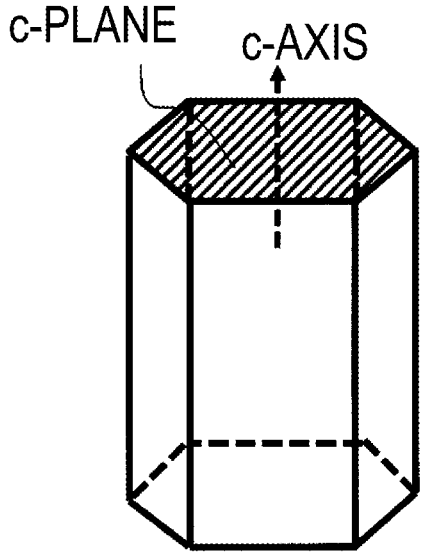
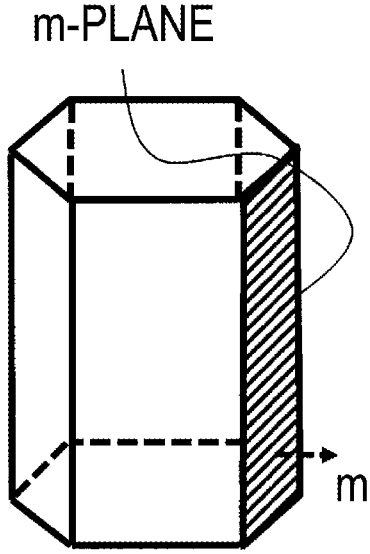
FIG. 2A  FIG. 2B
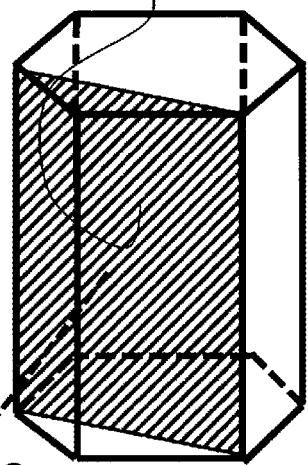
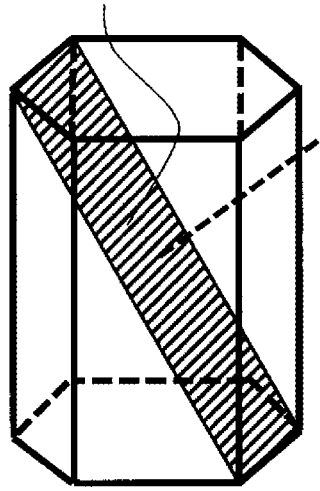
FIG. 2C  FIG. 2D

ELECTROSTATIC CHUCK

TECHNICAL FIELD

The present disclosure relates to an electrostatic chuck.

BACKGROUND OF INVENTION

In a manufacturing process or the like of a semiconductor product, an electrostatic chuck for adsorbing and holding a workpiece is used. Sapphire is a transparent insulator and can be used as an electrostatic chuck for applications requiring transparency such as an inspection device (Patent Document 1). Sapphire has better wear resistance than glass and is less susceptible to scratching. Sapphire has excellent corrosion resistance and can be used for a substrate adsorber of a plasma treatment device or the like. However, sapphire has anisotropy, and there is a problem in that adsorption force varies depending on, for example, a plane orientation.

CITATION LIST

Patent Literature

Patent Document 1: JP 6-291175 A

SUMMARY

Solution to Problem

An electrostatic chuck according to the present disclosure includes a plate-shaped body including an adsorption surface for mounting a workpiece, a base, and an electrode film located between the plate-shaped body and the base. The plate-shaped body and the base are made of sapphire. The angle between the adsorption surface and the c-plane of the sapphire is 45° or more.

BRIEF DESCRIPTION OF THE DRAWINGS

FIG. 2 is an explanatory diagram illustrating a crystalline structure of sapphire.

DESCRIPTION OF EMBODIMENTS

Figure 1:
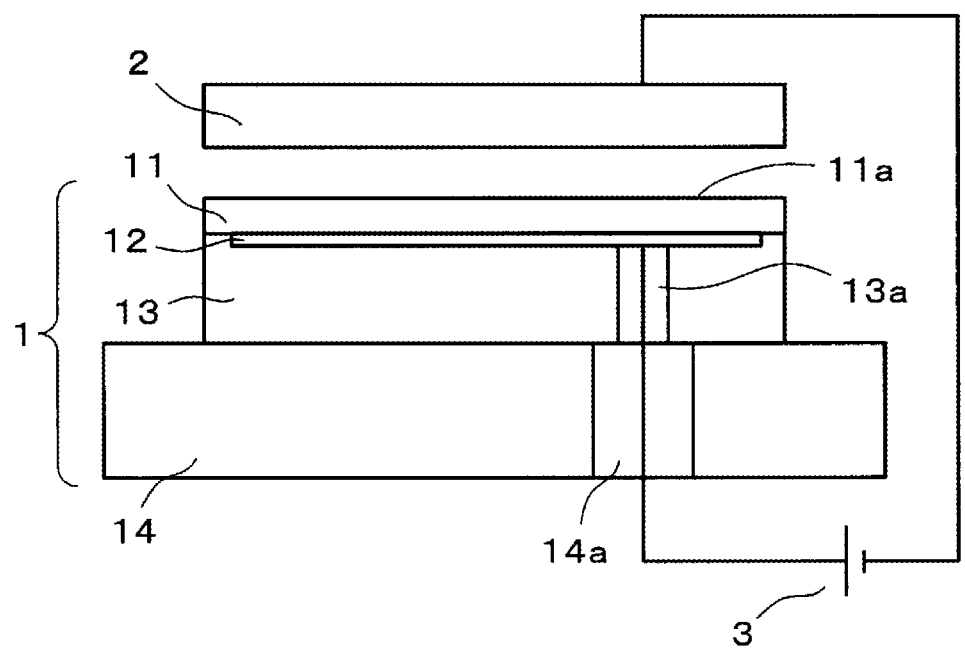
FIG. 1 is an explanatory view illustrating an electrostatic chuck according to one embodiment of the present disclosure.

As described above, sapphire has wear resistance and corrosion resistance, but has anisotropy, and there is a problem in that, for example, adsorption force varies depending on plane orientation. Therefore, there is a demand for an electrostatic chuck having excellent adsorption force.

In an electrostatic chuck according to the present disclosure, a plate-shaped body having an adsorption surface for mounting a workpiece is made of sapphire, and the angle between the adsorption surface and the c-plane of the sapphire is 45° or more. Therefore, the electrostatic chuck according to the present disclosure has excellent adsorption force.

As described above, the electrostatic chuck according to the present disclosure includes a plate-shaped body having an adsorption surface for mounting a workpiece, a base, and an electrode film located between the plate-shaped body and the base. The electrostatic chuck according to the present disclosure will be described with reference to FIGS. 1 and 2.

As illustrated in FIG. 1, an electrostatic chuck 1 according to one embodiment of the present disclosure includes a plate-shaped body 11 including an adsorption surface 11a for mounting a workpiece 2, a base 13, an electrode film 12 located between the plate-shaped body 11 and the base 13, and a pedestal 14.

The plate-shaped body 11 is made of sapphire, and its shape and size are not limited as long as it has a plate shape. The shape and size of the plate-shaped body 11 are appropriately set according to, for example, the shape and size of the workpiece 2. The plate-shaped body 11 may have, for example, a circular shape, an elliptical shape, or a polygonal shape (a triangular shape, a quadrilateral shape, a pentagonal shape, a hexagonal shape, or the like) in a plan view. The plate-shaped body 11 may have a thickness of, for example, 0.1 mm or more and 0.4 mm or less, and the adsorption surface 11a of the plate-shaped body 11 may have a diameter (width) of, for example, 100 mm or more and 400 mm or less.

The sapphire forming the plate-shaped body 11 is a single crystal of aluminum oxide ($Al_2O_3$). The sapphire is a transparent insulator and has excellent scratch resistance, heat resistance, thermal conductivity, and the like.

In the electrostatic chuck 1 according to one embodiment of the present disclosure, the angle between the adsorption surface 11a of the plate-shaped body 11 and the c-plane of the sapphire is 45° or more. Here, crystal planes of the sapphire are described. FIG. 2 illustrates the crystalline structure of the sapphire. As illustrated in FIGS. 2A to D, the sapphire has a hexagonal crystalline structure, and c-, m-, a-, and r-planes are present as representative crystal planes. Axes perpendicular to these planes are referred to as a c-axis, an m-axis, an a-axis, and an r-axis, respectively.

"The angle between the adsorption surface 11a and the c-plane of the sapphire is 45° or more" means that the adsorption surface 11a of the plate-shaped body 11 is formed so as to be inclined by 45° or more with respect to the c-plane illustrated in FIG. 2A, when the plate-shaped body 11 is obtained by, for example, processing a sapphire ingot. The angle between the adsorption surface 11a and the c-plane of the sapphire is 90° at maximum, and when the angle is 90°, the adsorption surface 11a is formed so as to be orthogonal to the c-plane (parallel to the c-axis). In order to further improve the adsorption force, the angle between the adsorption surface 11a and the c-plane of the sapphire may be 60° or more, and more preferably 75° or more.

In particular, the adsorption surface 11a is preferably the r-plane of the sapphire illustrated in FIG. 2D. The r-plane of the sapphire is inclined by about 57.6° with respect to the c-plane of the sapphire. The r-plane of the sapphire has good plasma resistance and is less susceptible to damage by, for example, plasma etching. The r-plane of the sapphire is a cleavage plane, is excellent in workability and productivity, and easily forms a mirror surface.

When the angle between the adsorption surface 11a and the c-plane of the sapphire is 45° or more, excellent adsorption force can be exhibited based on the following relational equation (I).

$$\text{Adsorption Force } F=(S/2)\times\varepsilon 0\times\varepsilon r\times(V/d)^2 \quad (I)$$

S: electrostatic electrode area
$\varepsilon 0$: dielectric constant of vacuum
$\varepsilon r$: relative permittivity of insulator
V: applied voltage
d: thickness of insulation layer That is, the larger the $\varepsilon r$ (relative permittivity of the insulator), the larger the adsorption force F, and thus the dielectric constant of the adsorption surface 11a may be made larger. In the sapphire, the c-plane (a plane orthogonal to the c-axis) has the smallest relative permittivity, and a plane parallel to the c-axis such as the a-plane or the m-plane has the largest relative permittivity. That is, a plane having a larger angle formed with the c-plane (inclination from the c-plane) has a larger dielectric constant. Therefore, the electrostatic chuck 1 according to one embodiment is specified such that "the angle between the adsorption surface 11a and the c-plane of the sapphire is 45° or more".

The base 13 is a member for fixing the plate-shaped body 11, and is made of the sapphire. The sapphire is as described above, and detailed description thereof will be omitted. In the electrostatic chuck 1 according to one embodiment, the plate-shaped body 11 and the base 13 are made of the transparent sapphire, and have excellent translucency. Since the base 13 does not contribute to electrostatic adsorption, the sapphire having a crystal orientation with a relatively large relative permittivity may be used. For example, the c-plane has no anisotropy of an index of refraction (birefringence) and no in-plane anisotropy of the coefficient of thermal expansion, and thus is suitable as the base 13. Birefringence does not occur in a plane such as the a-plane, the m-plane, or the like, which are perpendicular to the c-plane. Furthermore, the a-plane has high mechanical strength (flexural strength).

The shape and size of the base 13 are not limited, and are appropriately set according to, for example, the shape and size of the plate-shaped body 11. The base 13 may have, for example, a circular shape, an elliptical shape, or a polygonal shape (a triangular shape, a quadrilateral shape, a pentagonal shape, a hexagonal shape, or the like) in a plan view. The base 13 may have a thickness of, for example, 1 mm or more and 50 mm or less, and may have a thickness, for example, thicker than the plate-shaped body 11. A facing surface of the base 13 facing the plate-shaped body 11 has substantially the same shape and area as those of a facing surface of the plate-shaped body 11 facing the base 13, and may have a diameter (width) of, for example, 100 mm or more and 400 mm or less. As shown in the relational equation (I), the smaller the thickness of the plate-shaped body 11, the larger the adsorption force of the electrostatic chuck 1. Conversely, the larger the thickness of the base 13, the larger the mechanical strength of the electrostatic chuck 1. When the base 13 has a thickness greater than that of the plate-shaped body, the electrostatic chuck 1 having high adsorption force and mechanical strength can be provided.

The sapphire also has anisotropy in a coefficient of thermal expansion, and the coefficient of thermal expansion is maximum in a direction parallel to the c-axis, increases in a direction toward the c-axis, and decreases in a direction away from the c-axis. In the electrostatic chuck 1 according to one embodiment, the plate-shaped body 11 and the base 13 are preferably provided to face each other such that the c-axis of the sapphire forming the plate-shaped body 11 and the c-axis of the sapphire forming the base 13 are not parallel to each other. When the plate-shaped body 11 and the base 13 are provided in this manner, deformation due to anisotropy of the coefficient of thermal expansion of the plate-shaped body 11 is further reduced (canceled).

The electrode film 12 is located between the plate-shaped body 11 and the base 13, and is electrically connected to an external power supply 3. The shape and size of the electrode film 12 are not limited, and are appropriately set according to, for example, the shape and size of the plate-shaped body 11 and the base 13. The electrode film 12 preferably has translucency, and examples thereof include an indium tin oxide (ITO) film, a tin oxide film, and a zinc oxide film.

The pedestal 14 is a member for supporting the plate-shaped body 11, the electrode film 12, and the base 13 which are layered on one another, and is provided so that the base 13 is in contact with the pedestal 14. The pedestal 14 is not limited as long as it has a shape and a size capable of supporting the plate-shaped body 11, the electrode film 12, and the base 13 which are layered on one another. The pedestal 14 is made of, for example, a metal, a resin, or a ceramic.

As illustrated in FIG. 1, electrode extraction portions 13a and 14a are formed in the base 13 and the pedestal 14, respectively, and the electrode film 12 is electrically connected to the external power supply 3 via the electrode extraction portions 13a and 14a. The electrode extraction portions 13a and 14a are formed by providing through holes in the base 13 and the pedestal 14, respectively. A conductor for connecting the electrode film 12 to the power supply 3 passes through the through-holes (the electrode extraction portions 13a and 14a), so that the electrode film 12 is electrically connected to the power supply 3.

The method of bonding the plate-shaped body 11 to the base 13 is not limited. Examples of the method of bonding include a method of adhering using a UV-curable adhesive and a method of direct bonding by, for example, diffusion bonding.

The electrostatic chuck 1 according to one embodiment is provided in, for example, an inspection device. Examples of the inspection device include an outer appearance inspection device. The outer appearance inspection device includes a light source, a mount, and an imager, and inspects an outer appearance shape of an inspection object mounted on the mount. When the mount transparent to light from the light source is used, the light source, the inspection object, and the imager can be arranged on the same straight line, and thus the inspection accuracy can be improved with a simple configuration. In such an inspection device, the electrostatic chuck 1 adsorbs and holds the inspection object (workpiece 2), and inspection of the inspection object is performed. Examples of the inspection object (workpiece 2) include a substrate and an element which are made of a semiconductor, a metal, a ceramic, a resin, a single crystal, or the like.

A method of causing the electrostatic chuck 1 to adsorb the workpiece 2 according to one embodiment is as follows, for example. When a voltage is applied between the electrode film 12 and the workpiece 2 by the power supply 3, the plate-shaped body 11 made of the sapphire is dielectrically polarized. As a result, the workpiece 2 can be adsorbed on the adsorption surface 11a of the plate-shaped body 11 by Coulombic force. Both a positive electrode and a negative electrode may be formed, as the electrode film 12, between the plate-shaped body 11 and the base 13.

In the electrostatic chuck 1 according to one embodiment of the present disclosure, the angle between the adsorption surface 11a of the plate-shaped body 11 and the c-plane of the sapphire is 45° or more. Therefore, the electrostatic chuck 1 according to one embodiment can adsorb the workpiece 2 with a strong adsorption force.

The electrostatic chuck according to the present disclosure is not limited to the electrostatic chuck 1 according to the embodiment described above. In the electrostatic chuck 1 according to the embodiment, the pedestal 14 is provided as described above and supports the plate-shaped body 11, the electrode film 12, and the base 13 which are layered on one another. However, in the electrostatic chuck according to the present disclosure, the pedestal is not an essential member and need not be provided.

The electrostatic chuck 1 according to the embodiment is a monopolar electrostatic chuck including one electrode film 12. However, the electrostatic chuck according to the present disclosure may be a bipolar electrostatic chuck including a plurality of electrode films.

REFERENCE SIGNS

1 Electrostatic chuck
11 Plate-shaped body
11*a* Adsorption surface
12 Electrode film
13 Base
13*a* Electrode extraction portion
14 Pedestal
14*a* Electrode extraction portion
2 Workpiece
3 Power supply

The invention claimed is:

1. An electrostatic chuck comprising:
a plate-shaped body comprising an adsorption surface for mounting a workpiece;
a base; and
an electrode film located between the plate-shaped body and the base, wherein
the plate-shaped body and the base are made of sapphire, the plate-shaped body and the base face each other, a c-axis of the sapphire forming the plate-shaped body and a c-axis of the sapphire forming the base being not parallel to each other, and
an angle between the adsorption surface and a c-plane of the sapphire is 45° or more.

2. The electrostatic chuck according to claim 1, wherein a thickness of the base is greater than a thickness of the plate-shaped body.

3. The electrostatic chuck according to claim 1, wherein the electrode film has translucency.

* * * * *